United States Patent
Park et al.

(10) Patent No.: US 10,418,179 B2
(45) Date of Patent: Sep. 17, 2019

(54) MULTILAYER THIN-FILM CAPACITOR

(71) Applicant: SAMSUNG ELECTRO-MECHANICS CO., LTD., Suwon-si, Gyeonggi-do (KR)

(72) Inventors: No Il Park, Suwon-si (KR); Pil Joong Kang, Suwon-si (KR); Seung Mo Lim, Suwon-si (KR); Hyun Ho Shin, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/676,425

(22) Filed: Aug. 14, 2017

(65) Prior Publication Data
US 2018/0137983 A1 May 17, 2018

(30) Foreign Application Priority Data
Nov. 11, 2016 (KR) .................. 10-2016-0149983

(51) Int. Cl.
| H01G 4/33 | (2006.01) |
| H01G 4/232 | (2006.01) |
| H01G 4/30 | (2006.01) |
| H01L 23/48 | (2006.01) |
| H05K 1/16 | (2006.01) |

(52) U.S. Cl.
CPC ............. *H01G 4/306* (2013.01); *H01G 4/232* (2013.01); *H01G 4/33* (2013.01); *H01L 23/48* (2013.01); *H01L 23/481* (2013.01); *H05K 1/162* (2013.01)

(58) Field of Classification Search
CPC .................................. H01G 4/30; H01G 4/32
See application file for complete search history.

(56) References Cited

U.S. PATENT DOCUMENTS

| 6,344,961 | B1 | 2/2002 | Naito et al. | |
| 8,343,361 | B2 | 1/2013 | Takeshima et al. | |
| 2002/0158307 | A1* | 10/2002 | Honda | H01G 4/232 |
| | | | | 257/532 |

(Continued)

FOREIGN PATENT DOCUMENTS

| CN | 1892935 A | 1/2007 |
| CN | 100492560 C | 5/2009 |

(Continued)

OTHER PUBLICATIONS

Office Action issued in Chinese Application No. 201711089220.6 dated Jul. 2, 2019, with English translation.

*Primary Examiner* — Eric W Thomas
(74) *Attorney, Agent, or Firm* — Morgan, Lewis & Bockius LLP

(57) ABSTRACT

A multilayer thin-film capacitor includes a multilayer body in which a plurality of dielectric layers and first and second internal electrode layers are alternately stacked, and first and second external electrodes are disposed on the multilayer body and connected to the first and second internal electrode layers, respectively. The multilayer thin-film capacitor may include a first edge via connected to the external electrode and disposed at or adjacent at least one edge of an upper surface of the multilayer body, and a second edge via connected to the second external electrode and disposed at or adjacent at least one edge of the upper surface of the multilayer body.

15 Claims, 12 Drawing Sheets

(56) References Cited

U.S. PATENT DOCUMENTS

2010/0252527 A1* 10/2010 Takeshima ............ H01G 4/228
216/13
2013/0258545 A1 10/2013 Yano et al.

FOREIGN PATENT DOCUMENTS

| CN | 101896985 A | 11/2010 |
| CN | 105321716 A | 2/2016 |
| JP | 3489729 B2 | 1/2004 |
| JP | 2008-294008 A | 12/2008 |
| JP | 4930602 B2 | 5/2012 |
| JP | 2013-229582 A | 11/2013 |
| JP | 2014-090077 A | 5/2014 |

* cited by examiner

MULTILAYER THIN-FILM CAPACITOR

CROSS-REFERENCE TO RELATED APPLICATION(S)

This application claims priority under 35 U.S.C. § 119 to Korean Patent Application No. 10-2016-0149983 filed on Nov. 11, 2016, in the Korean Intellectual Property Office (KIPO), the disclosure of which is incorporated herein by reference in its entirety.

BACKGROUND

1. Field

The present disclosure relates to a multilayer thin-film capacitor.

2. Description of Related Art

The next-generation application processors mounted in smart phones are more thinner and lighter than the older processors. These newer processors require a more thinner and lighter multilayer thin-film capacitor than the existing multilayer ceramic capacitors (MLCCs) on the older processors. The newer multilayer thin-film capacitors may be may be developed using thin film technology, but a fewer number of dielectric layers may be included in these newer multilayer thin-film capacitors as compared to the number of dielectric films in existing a multilayer ceramic capacitor (MLCC). Thus, it may be difficult to manufacture capacitors have higher capacitance. When stacking a large number of dielectric layers using thin film technology, it may be required to have low equivalent series resistance (ESR) between metal electrode layers disposed on upper and lower surfaces of each dielectric layer. In order to obtain a low equivalent series resistance (ESR), vias may be formed connected to the metal electrode layers and a plurality of vias may be formed between external terminals and the electrode layers.

Existing methods of improving the stability and reliability of the electrical connection between internal electrode layers and connection electrodes in a thin-film capacitor to improve the connection reliability of the thin-film capacitor include rearranging the placement of the via, but these methods do not provide a low ESR device.

SUMMARY

An aspect of the present disclosure may provide a multilayer thin-film capacitor having a substantially lower equivalent series resistance (ESR).

According to an aspect of the present disclosure, a multilayer thin-film capacitor may include a multilayer body having first and second surfaces opposite each other in a length direction, third and fourth surfaces opposite each other in a width direction, and upper and lower surfaces opposite each other in a thickness direction, and having a stacked structure including a plurality of first internal electrode layers and a plurality of second internal electrode layers alternately stacked in the thickness direction and including a dielectric layer interposed between adjacent first and second internal electrode layers; first and second external electrodes connected to the first and second internal electrode layers, respectively; first and second edge vias connected to the first and second external electrodes, respectively, and disposed at or adjacent at least one edge of the upper surface of the multilayer body. The first external electrode and the first edge via may be disposed in a first section of the upper surface of the multilayer body, the second external electrode and the second edge via may be disposed in a second section of the upper surface of the multilayer body, and the second section may be spaced apart from the first section in the length direction.

According to another aspect of the present disclosure, a multilayer thin-film capacitor may include: a multilayer body having first and second surfaces opposite each other in a length direction, third and fourth surfaces opposite each other in a width direction, and upper and lower surfaces opposite each other in a thickness direction, and having a stacked structure including a plurality of first internal electrode layers and a plurality of second internal electrode layers alternately stacked in the thickness direction and including a dielectric layer interposed between adjacent first and second internal electrode layers, a first external electrode connected to the first internal electrode layer and disposed in a first section of the upper surface of the multilayer body; a second external electrode connected to the second internal electrode layer and disposed in a second section of the upper surface of the multilayer body spaced apart a predetermined interval from the first section at in the length direction; a plurality of first central vias and a plurality of second central vias disposed in a central section of the upper surface of the multilayer body between the first and second sections, and connected to the first and second external electrodes, respectively; a first central edge via disposed in the central section at or adjacent a first edge of two edges of the multilayer body opposite each other in the width direction, and connected to the first external electrode; and a second central edge via disposed in the central section at or adjacent a second edge opposite the first edge of the two edges of the multilayer body, and connected to the second external electrode.

BRIEF DESCRIPTION OF DRAWINGS

The accompanying drawings, which are included to provide further understanding and are incorporated in and constitute apart of this specification, illustrate disclosed embodiments and together with the description serve to explain the principles of the disclosed embodiments. In the drawings.

DETAILED DESCRIPTION

Hereinafter, a multilayer thin-film capacitor according to exemplary embodiments of the present disclosure will be described in detail with reference to the accompanying drawings.

First Exemplary Embodiment

A multilayer thin-film capacitor according to a first exemplary embodiment in the present disclosure will be described with reference to FIGS. 1A, 1B, and 1C.

The multilayer thin-film capacitor according to the present disclosure may include a multilayer body, a first external electrode disposed on an upper surface of the multilayer body, and a second external electrode having a polarity opposite from that of the first external electrode and disposed on the upper surface of the multilayer body.

Although not specifically illustrated, the multilayer body may have first and second surfaces opposing each other in a length (L) direction, third and fourth surfaces opposing each other in a width (W) direction, and upper and lower surfaces opposing each other in a thickness (T) direction, to thereby have a substantially hexahedral shape, but the shape is not limited thereto. The multilayer body may include a plurality of first internal electrode layers and a plurality of second internal electrode layers alternatively stacked in a thickness direction, and having a dielectric layer interposed between adjacent first internal electrode layers and between adjacent second internal electrode layers. A method of manufacturing the multilayer body is not limited to any particular method. For example, a thin film stacking method may be performed by forming a $SiO_2$ layer on a bare Si wafer, and sequentially and repeatedly stacking the first internal electrode layer, the dielectric layer, and the second internal electrode layer. The first and second internal electrode layers may be or include metal type electrode layers including Pt, Ir, Ru, Cu, $IrO_2$, a combination thereof and the like, and, as a dielectric material may be or include $BaTiO_3$, barium strontium titanate (BST), $Pb(Zr, Ti)O_3$ a (PZT)-based dielectric material, a $Pb(Nb, Zr, Ti)O_3$ (PNZT)-based dielectric material, a $SiO_2$-based dielectric material, a combination thereof, and the like. A dielectric layer serving as a protection layer may be additionally formed on an outermost (e.g., the uppermost and/or the lowermost) internal electrode layer, and then a thin film layer may be formed by applying an insulating film formed of SiNx, $SiO_2$, a combination thereof and the like.

Figure 1A:
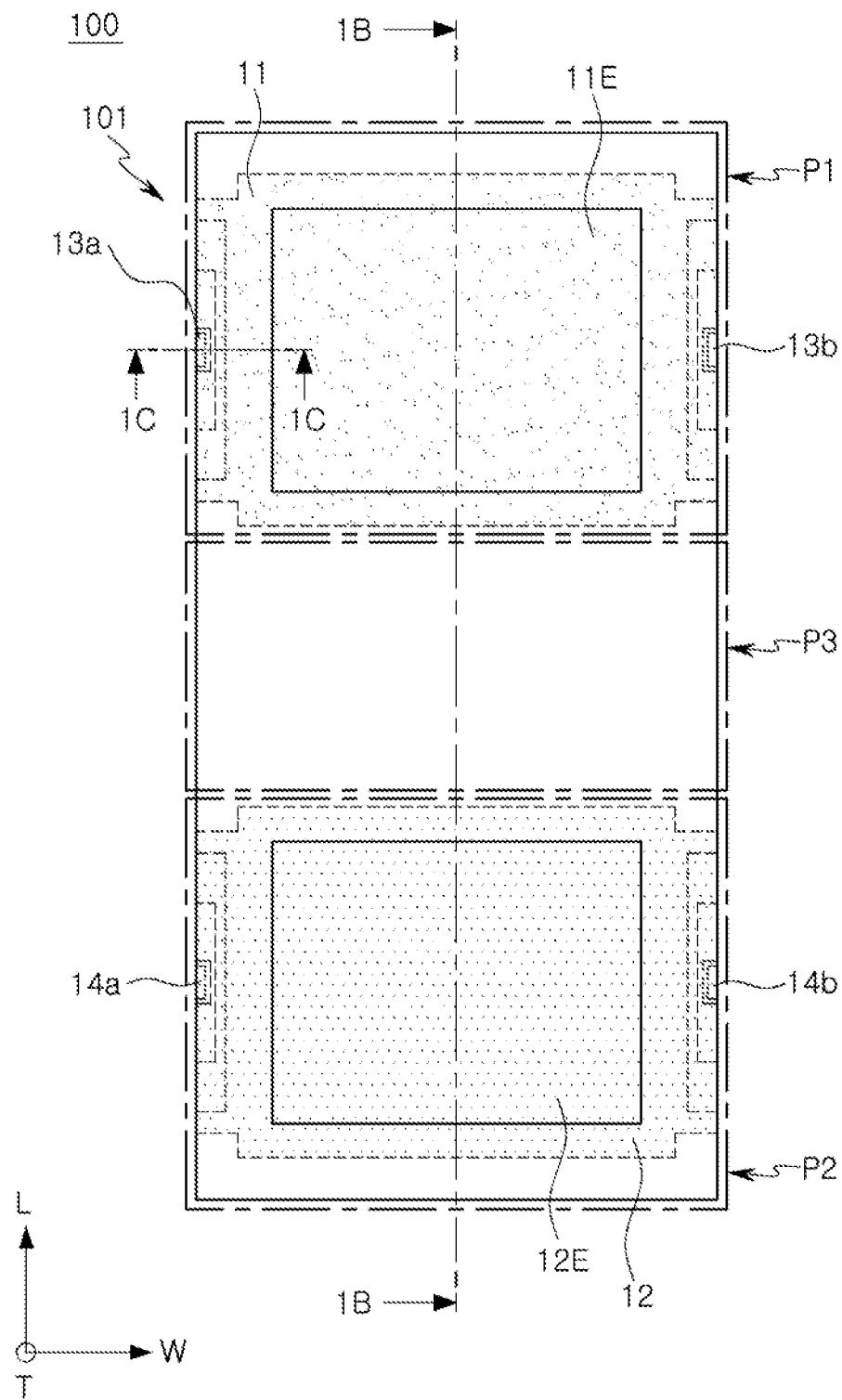
FIG. 1A is a schematic plan view of a multilayer thin-film capacitor according to a first exemplary embodiment in the present disclosure.

FIG. 1A is a plan view of the upper surface of the multilayer body 101 of a multilayer thin-film capacitor 100. FIG. 1B is a cross-sectional view of the multilayer thin-film capacitor 100 taken along 1B-1B in FIG. 1A. FIG. 1C is a cross-sectional view of the multilayer thin-film capacitor 100 taken along 1C-1C in FIG. 1A. For the sake of clarity of illustration, a polymer based passivation layer L is omitted from FIG. 1A.

Referring to FIG. 1A, the first and second external electrodes 11 and 12, first edge vias 13a and 13b, and second edge vias 14a and 14b may be disposed on the upper surface of the multilayer body. The first external electrode 11 and the first edge vias 13a and 13b may be connected to each other, and may have the same polarity as each other. The second external electrode 12 and the second edge vias 14a and 14b may be connected to each other, and may have the same polarity as each other. The first external electrode 11 and the first edge vias 13a and 13b may have a different polarity than the second external electrode 12 and the second edge vias 14a and 14b. The first external electrode 11 may be connected to the first internal electrode layer through the vias 13a and 13b, and the second external electrode 12 may be connected to the second internal electrode layer through the vias 14a and 14b, thereby defining the capacitance of the multilayer thin-film capacitor.

For the sake of explanation, FIG. 1A illustrates a region 11E enclosed by the solid line in the first external electrode 11. The region 11E indicates a region on the multilayer thin-film capacitor 100 which is not covered by the polymer based passivation layer L and is externally exposed. As illustrated in FIG. 1B, the first external electrode 11 is disposed in the region 11E. Similarly, a region 12E enclosed by a solid line is illustrated in the second external electrode 12. The region 12E indicates a region on the multilayer thin-film capacitor 100 which is also not covered by the polymer based passivation layer L and is externally exposed. As illustrated in FIG. 1B, the second external electrode 12 is disposed in the region 12E.

Figure 1B:
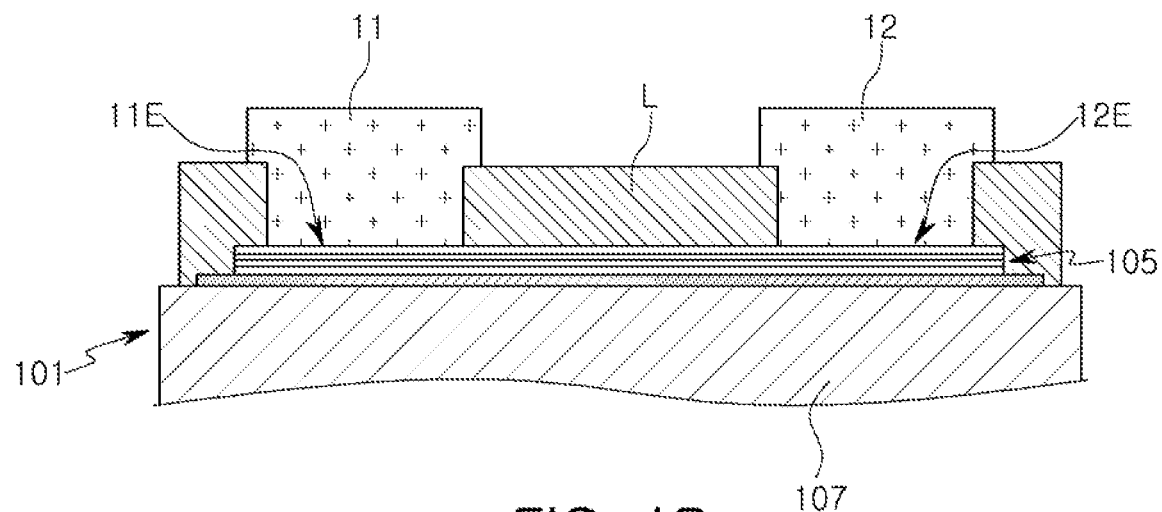
FIG. 1B is a cross-sectional view of the multilayer thin-film capacitor of FIG. 1A taken along 1B-1B.

Referring to FIG. 1B, with continued reference to FIG. 1A, illustrates the multilayer body 101 of the multilayer thin-film capacitor 100 including the plurality of first internal electrode layers and the plurality of second internal electrode layers alternatively stacked in a thickness direction (vertical direction, in FIG. 1B), and having the dielectric layer interposed between adjacent first internal electrode layers and between adjacent second internal electrode layers. The plurality of first internal electrodes layers, the plurality of second internal electrodes, and the dielectric layers (collectively referenced at 105) are disposed on a Si (or similar) wafer 107. The passivation layer L is disposed on the body 101 and regions 11E and 12E on the body 101 that do not include the passivation layer L are defined. As illustrated, the first external electrode 11 is disposed in the region 11E and the second external electrode 12 is disposed in the region 12E. The first external electrode 11 may be connected to the plurality of first internal electrode layers and the second external electrode 12 may be connected to the plurality of second internal electrode layers.

Figure 1C:
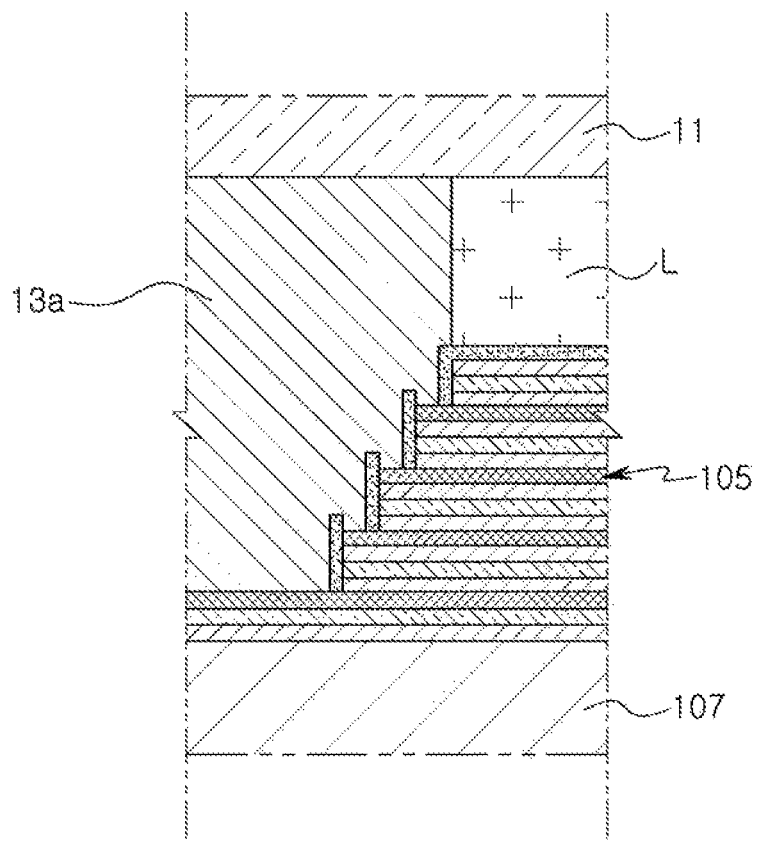
FIG. 1C is a cross-sectional view of the multilayer thin-film capacitor of FIG. 1A taken along 1C-1C.

Referring to FIG. 1C, with continued reference to FIGS. 1A and 1B, illustrated is a structure of the first edge via 13a defined in the body 101. The second edge via 13b may have similar structure as the first edge via 13a. In an example, the first and second edge vias 13a, 13b may be filled with a conductive material.

The upper surface (as seen in FIG. 1A) of the multilayer body 101 may be divided into a first section P1, a second section P2, and a central section P3.

The first section P1 includes a region in which the first external electrode 11 is disposed and a peripheral region thereof, wherein the peripheral region includes one edge of the upper surface of the multilayer body 101 in the length direction and at least portions of both edges of the upper surface of the multilayer body 101 in the width direction.

The first section P1 may include the region in which the first external electrode 11 is disposed, and the peripheral region in which the passivation layer L is disposed. The first external electrode may include a Ti/W, Ti/Cu, or Ti/Al seed layer that is connected to the first internal electrode layer through the via, and an Au, Cu, or electroless nickel immersion gold (ENIG) layer treated by a plating method.

Among the first and second external electrodes 11 and 12, only the first external electrode 11, and not the second external electrode 12, may be disposed in the first section P1.

The first edge vias 13a and 13b, connected to the first external electrode 11 and disposed at or adjacent (or along) edges of the upper surface of the multilayer body, may be also disposed in the first section P1. The first edge vias 13a and 13b may decrease the ESR of the multilayer thin-film capacitor. Although FIG. 1A illustrates the first edge vias 13a and 13b disposed at or adjacent (or along) opposite edges of the upper surface of the multilayer body 101 in the width direction W, respectively, in other embodiments, both the first edge vias 13a and 13b may be disposed at or adjacent (or along) the same edge of the two edges.

The first edge vias 13a and 13b may be electrically connected to the first internal electrode layer in the multilayer body 101, and a shape of the first edge vias 13a and 13b is not limited to any particular shape. For example, the first edge vias 13a and 13b may have a tapered shape, and a cross section thereof may be circular. Alternatively, the first edge vias 13a and 13b may have a step shape, and a cross section thereof may have a polygonal shape or an oval shape. However, the first edge vias 13a and 13b may any shape as desired by the application and design. Further, the shape of the first edge vias 13a and 13b is not limited to a symmetric or asymmetric shape.

Meanwhile, the second section P2 includes a region in which the second external electrode 12 is disposed and a peripheral section thereof is a section spaced apart from the first section P1 at a determined interval in the length direction L of the multilayer body 101. Here, the peripheral section may include one edge of the upper surface of the multilayer body 101 in the length direction and at least some portion of both edges of the upper surface of the multilayer body 101 in the width direction W.

Similar to the first section P1, the second section P2 may include the region on which the second external electrode, including a Ti/W, Ti/Cu, or Ti/Al seed layer connected to the second internal electrode layer through the via, and an Au, Cu, or electroless nickel immersion gold (ENIG) layer treated by a plating method, is disposed, and the peripheral region on which the passivation layer L is disposed.

Among the first and second external electrodes 11 and 12, only the second external electrode 12, and not the first external electrode 11, may be disposed in the second section P2.

The second edge vias 14a and 14b connected to the second external electrode 12 and disposed at or adjacent (or along) the edges of the upper surface of the multilayer body 101 may be further disposed in the second section P2. The second edge vias 14a and 14b may decrease the ESR of the multilayer thin-film capacitor. Although the second edge vias 14a and 14b are disposed at or adjacent (or along) opposite edges of the upper surface of the multilayer body 101 in the width direction, as illustrated in FIG. 1A, in other embodiments, both the second edge vias 14a and 14b may be disposed at or adjacent (or along) the same edge of the two edges.

The second edge vias 14a and 14b may have a shape same as or different from the shape of the first edge vias 13a and 13b described above, and the shape of the second edge vias 14a and 14b is not limited to any particular shape.

The first and second sections P1 and P2 may be spaced apart from each other in the length direction L, with the central section P3 interposed therebetween on the upper surface of the multilayer body 101. According to the first exemplary embodiment in the present disclosure, the polymer based passivation layer L may be applied to the central section P3.

According to the first exemplary embodiment in the present disclosure, since the multilayer thin-film capacitor 100 includes the first and second edge vias 13a, 13b, and 14a, 14b in addition to the first and second external electrodes 11 and 12, a via density (e.g., a number of vias in a given (or unit) space) may be higher, and the ESR of the capacitor may be lower. In addition, process efficiency may be improved by disposing the first and second edge vias 13a, 13b, 14a, and 14b at or adjacent (or along) the edges of the upper surface of the multilayer body 101, through which a cutting tool (e.g., a saw) path passes in a wafer level array prior to cutting the wafer into individual multilayer thin-film capacitors.

Second Exemplary Embodiment

A multilayer thin-film capacitor 200 according to a second exemplary embodiment in the present disclosure will be described with reference to FIG. 2. The multilayer thin-film capacitor 200 may be similar in some respects to the multilayer thin-film capacitor 100 in FIG. 1A, and therefore may be best understood with reference thereto where like numerals designate like components not described again in detail.

Figure 2:
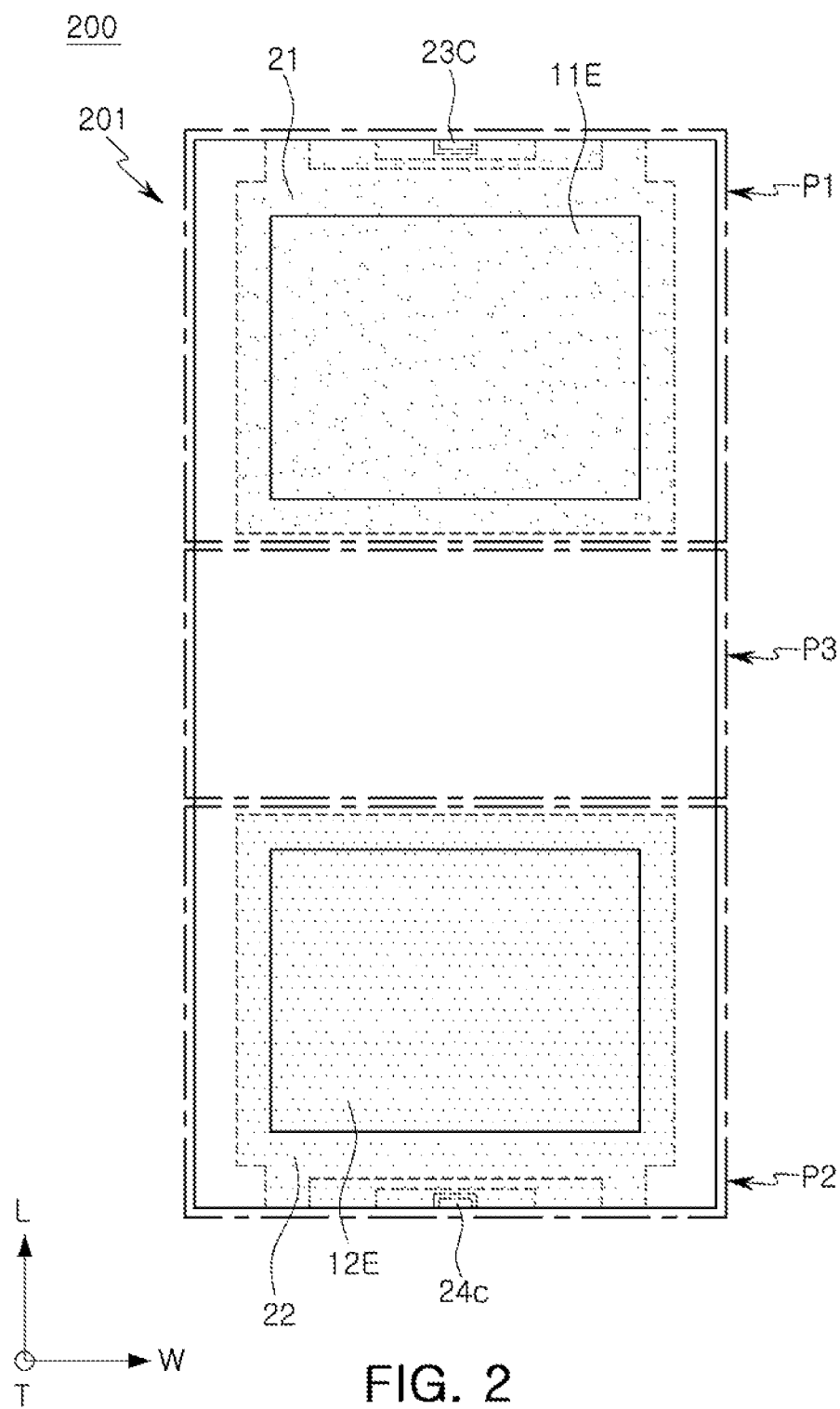
FIG. 2 is a schematic plan view of a multilayer thin-film capacitor according to a second exemplary embodiment in the present disclosure.

Referring to FIG. 2, first and second external electrodes 21 and 22 may be disposed on an upper surface of a multilayer body 201. In particular, the first external electrode 21 may be disposed in a first section P1, and the second external electrode 22 may be disposed in a second section P2.

According to the second exemplary embodiment, first and second edge vias 23c and 24c may be disposed at or adjacent (or along) opposite edges of the upper surface of the multilayer body 101 in a length direction L. The structure of the first and second edge vias 23c and 24c may be similar to the vias 13a and 13b. The first edge via 23c may be connected to the first external electrode 21 and the first edge via 23c may be disposed in the first section P1 in which the first external electrode 21 is disposed. The second edge via 24c may be connected to the second external electrode 22 and the second edge via 24c may be disposed in the second section P2 in which the second external electrode 22 is disposed.

Since the first and second edge vias 23c and 24c are disposed at or adjacent (or along) opposite edges of the upper surface of the multilayer body 101 in the length direction, the first and second edge vias 23c and 24c may be disposed over a relatively larger area. Therefore, the first and second edge vias 23c and 24c may be configured as long edge vias that may be elongated in the width direction W. As a result, exposure areas of first and second internal electrode layers to the vias 23c and 24c may be increased.

Third Exemplary Embodiment

A multilayer thin-film capacitor 300 according to a third exemplary embodiment in the present disclosure will be described with reference to FIG. 3. The multilayer thin-film capacitor 300 may be similar in some respects to the multilayer thin-film capacitors 100 and 200 in FIGS. 1A and 2, and therefore may be best understood with reference thereto where like numerals designate like components not described again in detail.

Figure 3:
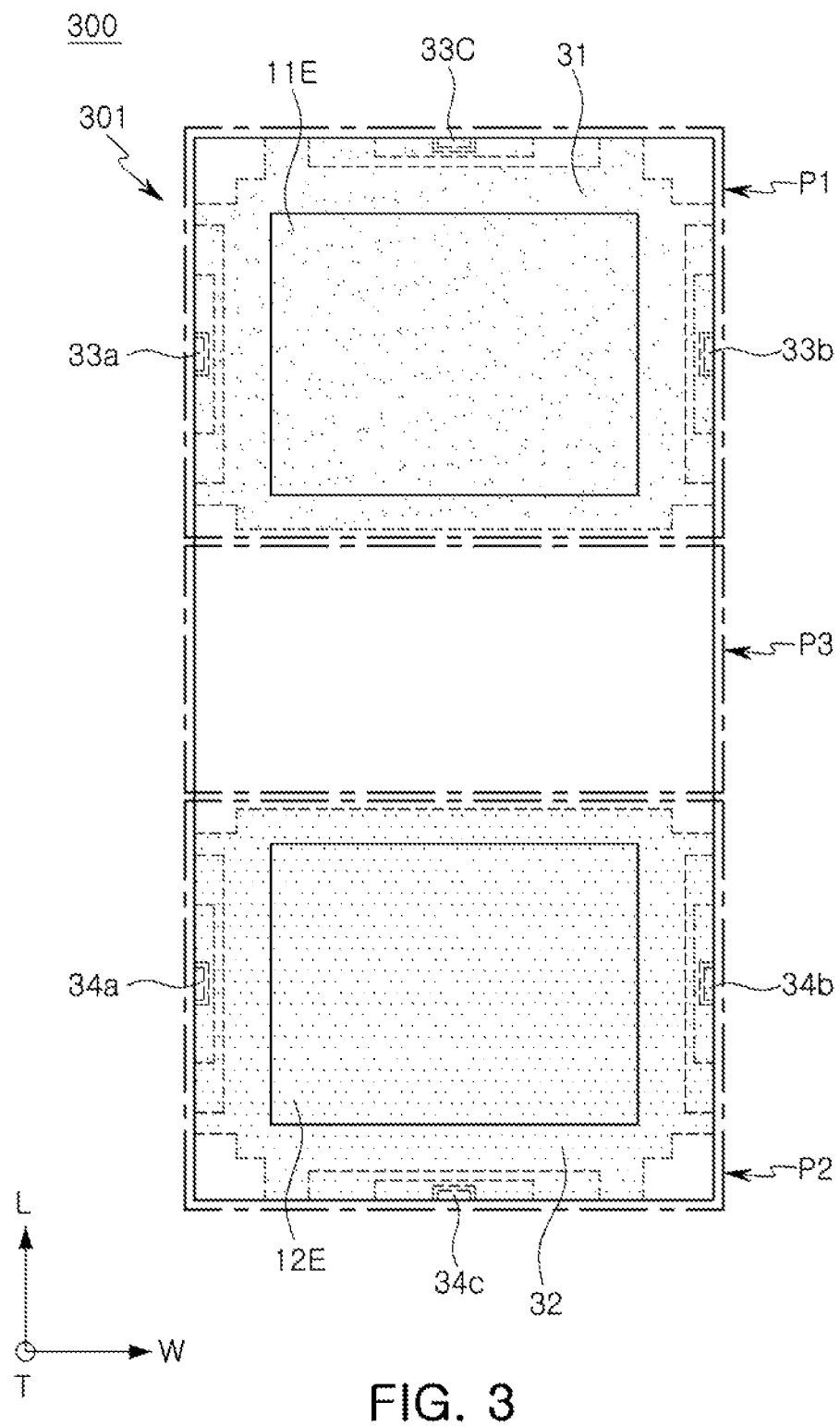
FIG. 3 is a schematic plan view of a multilayer thin-film capacitor according to a third exemplary embodiment in the present disclosure.

Referring to FIG. 3, first and second external electrodes 31 and 32 may be disposed on an upper surface of a multilayer body 301. In particular, the first external electrode 31 may be disposed in a first section P1, and the second external electrode 32 may be disposed in a second section P2.

According to the third exemplary embodiment, first and second edge vias 33a to 33c and 34a to 34c may be disposed at or adjacent (or along) edges of the upper surface of the multilayer body 301 in a length direction, and at or adjacent (or along) edges of the multilayer body 301 in a width direction W. The structure of the first and second edge vias 33a to 33c and 34a to 34c may be similar to the vias 13a and 13b. A plurality of first edge vias 33a to 33c may be connected to the first external electrode 31 and the plurality of first edge vias 33a to 33c may be disposed in the first section P1 in which the first external electrode 31 is disposed. A plurality of second edge vias 34a to 34c are connected to the second external electrode 32 and the plurality of first edge vias 34a to 34c may be disposed in the second section P2 in which the second external electrode 32 is disposed.

The first edge vias 33a and 33b may be disposed at or adjacent (or along) opposite edges of the multilayer body 301 in the width direction W in the first section P1, and the first edge via 33c may be disposed in the first section P1 at or adjacent (or along) an edge of the multilayer body 301 that extends perpendicular to the length direction L. The first edge vias 33a and 33b may be long edge vias elongated in the length direction L, and the first edge via 33c may be a long edge via elongated in the width direction.

Similarly, the second edge vias 34a and 34b may be disposed at or adjacent (or along) opposite edges of the multilayer body 301 in the width direction W, and the second edge via 34c may be disposed in the second section P2 at or adjacent (or along) an edge of the multilayer body 301 that extends perpendicular to the length direction L. The second edge vias 34a and 34b may be long edge vias elongated in the length direction L, and the second edge via 34c may be a long edge via elongated in the width direction W.

Since a via density of the multilayer thin-film capacitor 300 according to the third exemplary embodiment is relatively higher than that of the multilayer thin-film capacitor 300 according to the first and/or second exemplary embodiments described above, the ESR may be relatively lower than the ESR in the first and/or second exemplary embodiments.

Fourth Exemplary Embodiment

Next, a multilayer thin-film capacitor 400 according to a fourth exemplary embodiment in the present disclosure will be described with reference to FIG. 4.

Figure 4:
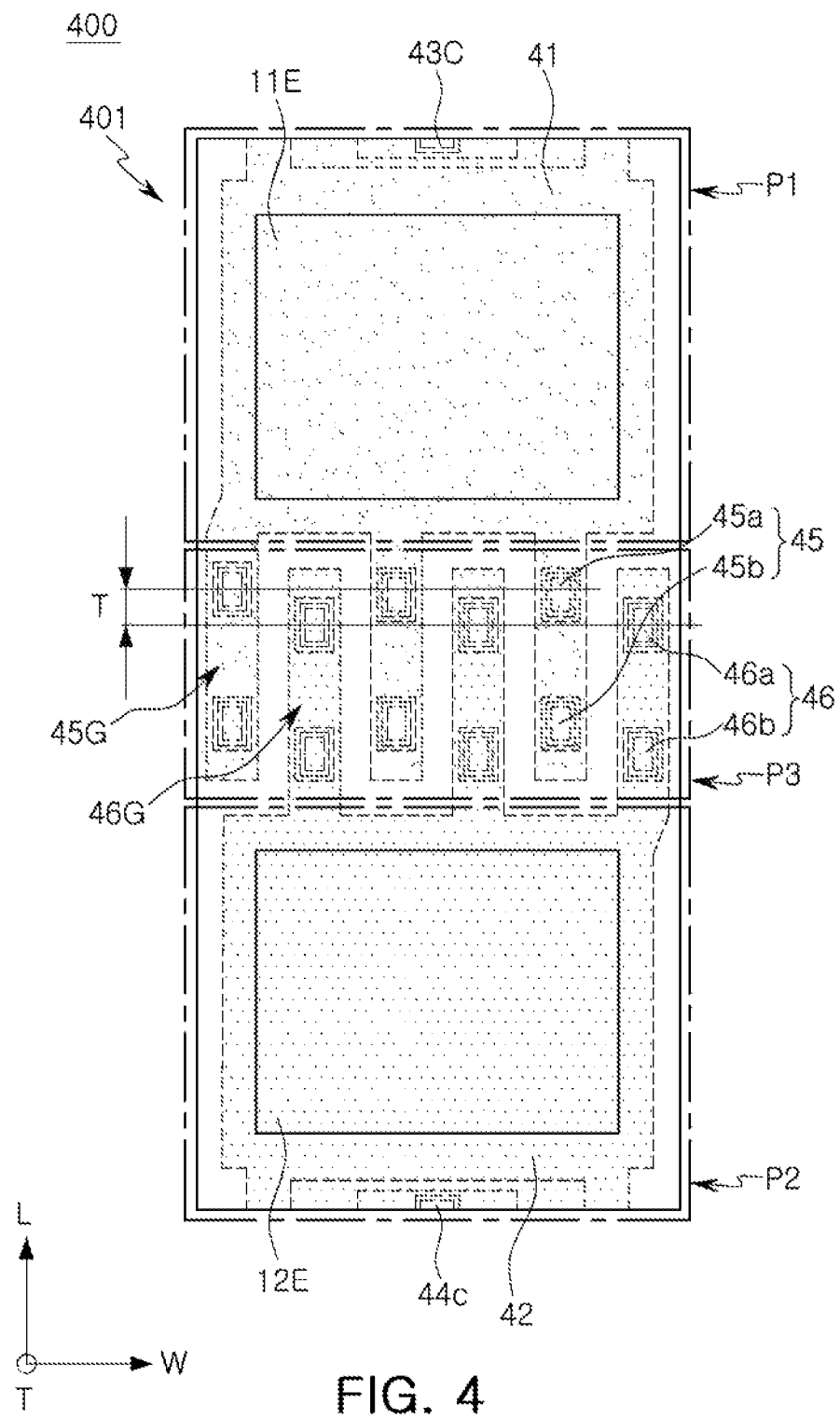
FIG. 4 is a schematic plan view of a multilayer thin-film capacitor according to a fourth exemplary embodiment in the present disclosure.

The multilayer thin-film capacitor 400 according to the fourth exemplary embodiment illustrated in FIG. 4 may include first and second central vias 45 and 46. The structure of the first and second central vias 45 and 46 may be similar to the vias 13a and 13b.

Referring to FIG. 4, a plurality of first and second central vias 45 and 46 may be disposed in a central section P3, which is interposed between first and second sections P1 and P2 in a length direction of a multilayer body 401.

The first central vias 45 may be connected to a first external electrode 41 and may include one or more first central vias 45a and 45b (one of each shown) disposed spaced apart from each other at predetermined intervals in the length direction L and defining a first central via group 45G. Multiple first central via groups 45G may be disposed separated from each other in a width direction W. The number of first central vias 45 is not limited to any particular number, and may be selected based on the desired characteristics of the capacitor, the application, and design.

The second central vias 46 may be connected to a second external electrode 42 and may include one or more second central vias 46a and 46b (one of each shown) disposed spaced apart from each other at predetermined internals in the length direction L and defining a second central via group 46G. Multiple second central via groups 46G may be disposed separated from each other in the width direction W. As illustrated, the first central via groups 45G and the second central via groups 46G may form an intervening pattern in the width direction W. The number of second central vias 46 is not limited to any particular number, and may be selected based on the desired characteristics of the capacitor, the application, and design.

The first and second central via groups 45G and 46G may be disposed offset from each other at a predetermined interval T in the length direction L of the multilayer body 401. Stated otherwise, the centers of the vias 45a and 46a, and those of the vias 45b and 46b do not lie on the same straight line (non-collinear). The central vias 45 and 46 may be disposed such that a space utilization is optimized. The predetermined interval T is not limited a particular value, but may be selected based on the desired characteristics of the capacitor, process conditions, or the like. For the purposes of discussion, the center of the vias 45 and 46 may mean a central point of a region in which the via is formed in a lowermost internal electrode layer to which the via is connected.

Next, multilayer thin-film capacitors 500 to 1100 according to fifth to eleventh exemplary embodiments in the present disclosure will be described. The multilayer thin-film capacitors 500 to 1100 according to fifth to eleventh exemplary embodiments may commonly include the first and second central vias 45 and 46 included in the multilayer thin-film capacitor 400 according to the fourth exemplary embodiment. The multilayer thin-film capacitors 500 to 1100 may be similar in some respects to the multilayer thin-film capacitors 100-400 in above FIGS. 1A, 2, 3, and 4, and therefore may be best understood with reference thereto where like numerals designate like components not described again in detail.

Fifth Exemplary Embodiment

Figure 5:
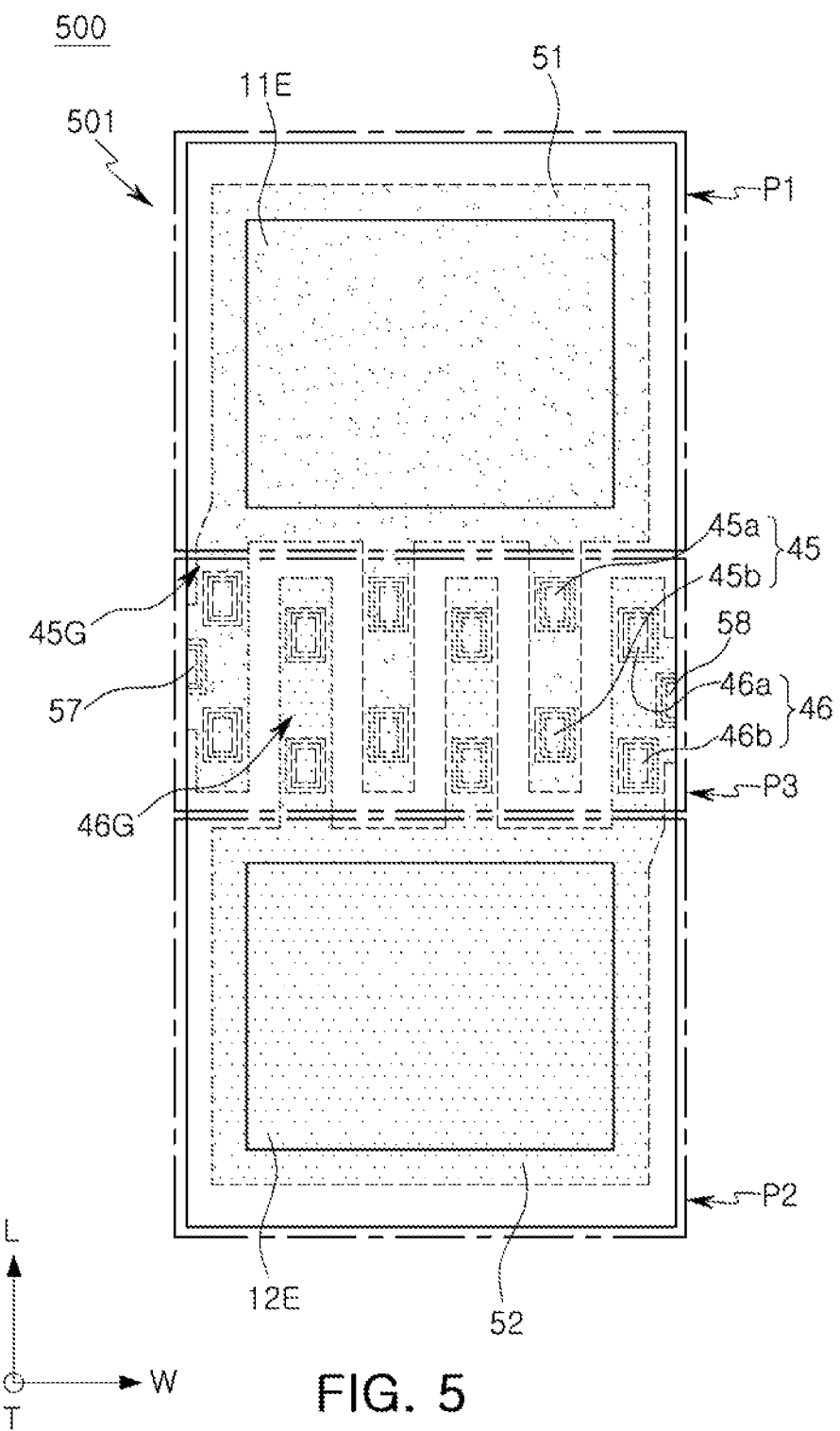
FIG. 5 is a schematic plan view of a multilayer thin-film capacitor according to a fifth exemplary embodiment in the present disclosure.

FIG. 5 is a schematic plan view of the multilayer thin-film capacitor 500 according to the fifth exemplary embodiment. The multilayer thin-film capacitor 500 may be similar in some respects to the multilayer thin-film capacitors 100-400 in FIGS. 1A, 2, 3, and 4, and therefore may be best understood with reference thereto where like numerals designate like components not described again in detail. Referring to FIG. 5, the multilayer thin-film capacitor 500 may include a first external electrode 51 disposed in a first section P1, a second external electrode 52 disposed in a second section P2, and first and second central vias 45 and 46 disposed in a central section P3. The first external electrode 51 and the first central via 45 may be connected (e.g., electrically) to each other, and the second external electrode 52 and the second central via 46 may be connected (e.g., electrically) to each other.

The first central via 45 may include one or more first central vias 45a and 45b (one of each shown) disposed spaced apart from each other at predetermined intervals in the length direction L and defining a first central via group 45G, similar to the multilayer thin-film capacitor 400. Multiple first central via groups 45G may be disposed separated from each other in the width direction W. Similarly, the second central vias 46 may include one or more second central vias 46a and 46b (one of each shown) disposed spaced apart from each other at predetermined intervals in the length direction L and defining a second central via group 46G. Multiple second central via groups 46G may be disposed separated from each other in the width direction W.

The multilayer thin-film capacitor 500 may also include first and second central edge vias 57 and 58. As a result, a via density of the multilayer thin-film capacitor 500 is higher and the ESR is lower.

Referring to FIG. 5, the first central edge via 57 may be disposed in the central section P3 at or adjacent (or along) one of the two edges of the multilayer body 501 that are opposite each other in the width direction W, and may be connected to the first external electrode 51. The first central edge via 57 may be positioned between the first central vias 45a and 45b of the first central via group 45G. The first central edge via 57 may be offset from the first central vias 45a and 45b at predetermined intervals in the length and width directions. Stated otherwise, the centers of the first central edge via 57 and the first central vias 45a and 45b are not collinear.

Although the first central edge via 57 is illustrated having a shape similar to that of the first central vias 45a and 45b, the shapes of the first central edge via 57 and the first central vias 45a and 45b are not limited thereto, and the vias 57, 45a, and 45b may have desired shapes (either same or different) based on application, design, and space constraints.

The second central edge via 58 may be disposed in the central section P3 at or adjacent the edge of the multilayer body 501 opposite the edge having the first central edge via 57 in the width direction W. The second central edge via 58 may be connected to the second external electrode 52 and positioned between the second central vias 46a and 46b of the second central via group 46G. The second central edge via 58 may be offset from the second central vias 46a and 46b at predetermined intervals in the length and width directions. Stated otherwise, the centers of the second central edge via 58 and the second central vias 46a and 46b are not collinear. As illustrated, the first central via groups 45G and the second central via groups 46G may form an intervening pattern in the width direction W.

Although the second central edge via 58 is illustrated having a shape similar to that of the second central vias 46a and 46b, the shapes of the second central edge via 58 and the second central vias 46a and 46b are not thereto, and the vias 58, 46a, and 46b may have desired shapes (either same or different) based on application, design, and space constraints.

Sixth Exemplary Embodiment

The multilayer thin-film capacitor 600 according to the sixth exemplary embodiment in the present disclosure will be described with reference to FIG. 6. The multilayer thin-film capacitor 600 may be similar in some respects to the multilayer thin-film capacitor 500 in FIG. 5, and therefore may be best understood with reference thereto where like numerals designate like components not described again in detail. The multilayer thin-film capacitor 600 of FIG. 6 may further include first and second edge vias 63b and 64a, located in first and second sections P1 and P2, respectively.

The first edge via 63b may be connected, along with the first central via 45 and a first central edge via 57, to a first external electrode 61, and the second edge via 64a may be connected, along with the second central via 46 and a second central edge via 58, to a second external electrode 62.

The first edge via 63b may be disposed in the first section P1 at or adjacent one of the two edges of the multilayer body 601 opposite each other in a width direction W. However, a location of the first edge via 63b is not limited thereto, and the first edge via 63b may be located at any desired location in the first section P1. Although the first edge via 63b is illustrated located in a region of the first section P1 adjacent to the central section P3 and at or adjacent (or along) one of the two edges of the multilayer body 601 opposite each other in the width direction W, the location of the first edge via 63b is not limited thereto.

Similarly, the second edge via 64a may be disposed in the second section P2 at or adjacent the edge of the multilayer body 601 opposite the edge having the first edge via 63b in the width direction W. However, location of the second edge via 64a is not limited thereto, and the second edge via 64a may be located at any desired location in the second section P2. Although the second edge via 64a is illustrated located in a region of the second section P2 adjacent the central section P3 and at or adjacent (or along) an edge of the multilayer body 601 opposite the edge having the first edge via 63b, the location of the second edge via 64a is not limited thereto.

Seventh Exemplary Embodiment

Figure 6:
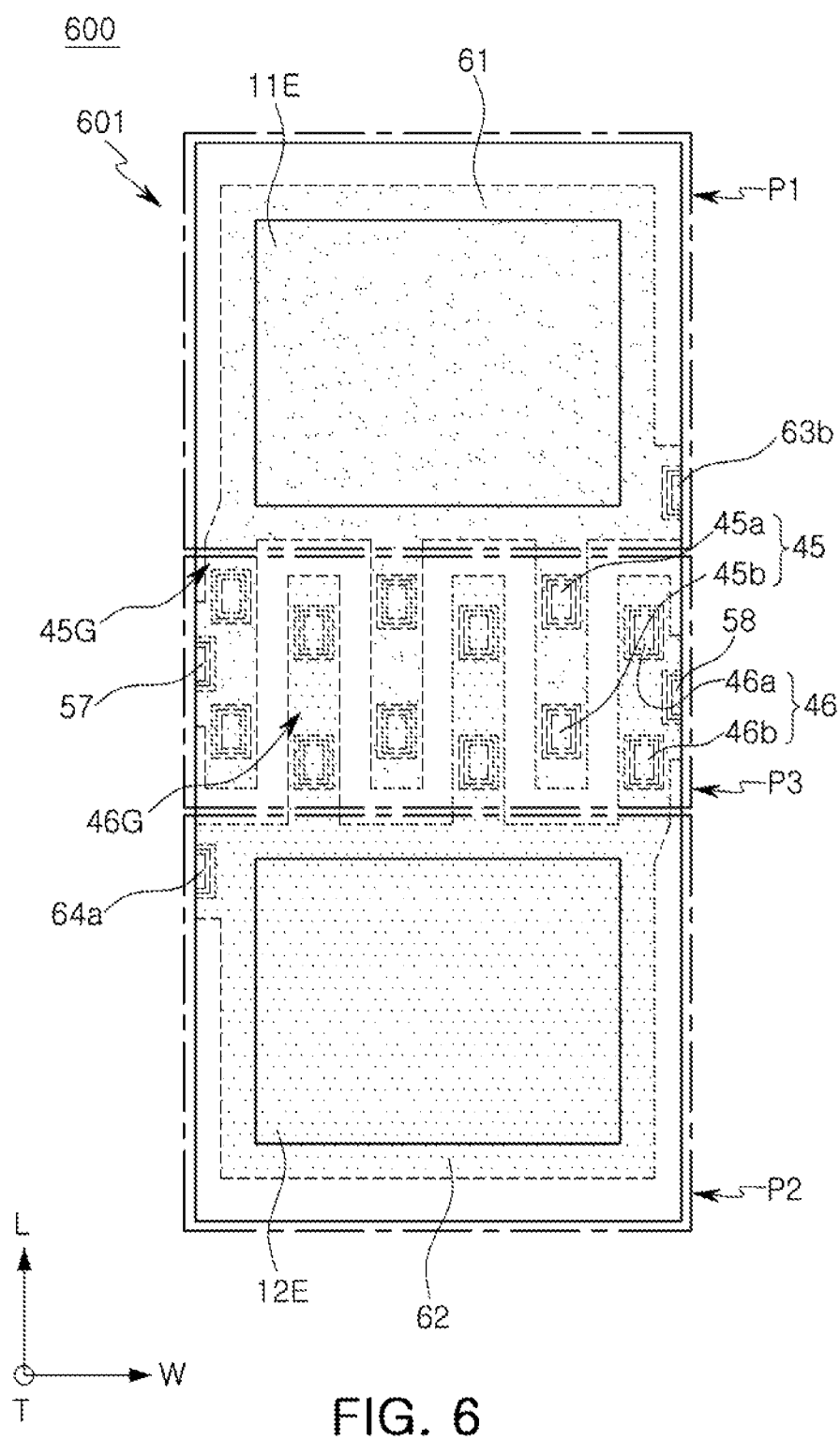
FIG. 6 is a schematic plan view of a multilayer thin-film capacitor according to a sixth exemplary embodiment in the present disclosure.

FIG. 6 illustrates a multilayer thin-film capacitor 700 according to the seventh exemplary embodiment in the present disclosure. The multilayer thin-film capacitor 700 may be similar in some respects to the multilayer thin-film capacitors 500 and 600 in FIGS. 5 and 6, and therefore may be best understood with reference thereto where like numerals designate like components not described again in detail. The multilayer thin-film capacitor 700 may include first and second edge vias 73b and 74a as long edge vias in the first and second sections P1 and P2, respectively.

The first and second edge vias 73b and 74a may be connected to first and second external electrodes 71 and 72, respectively.

Figure 7:
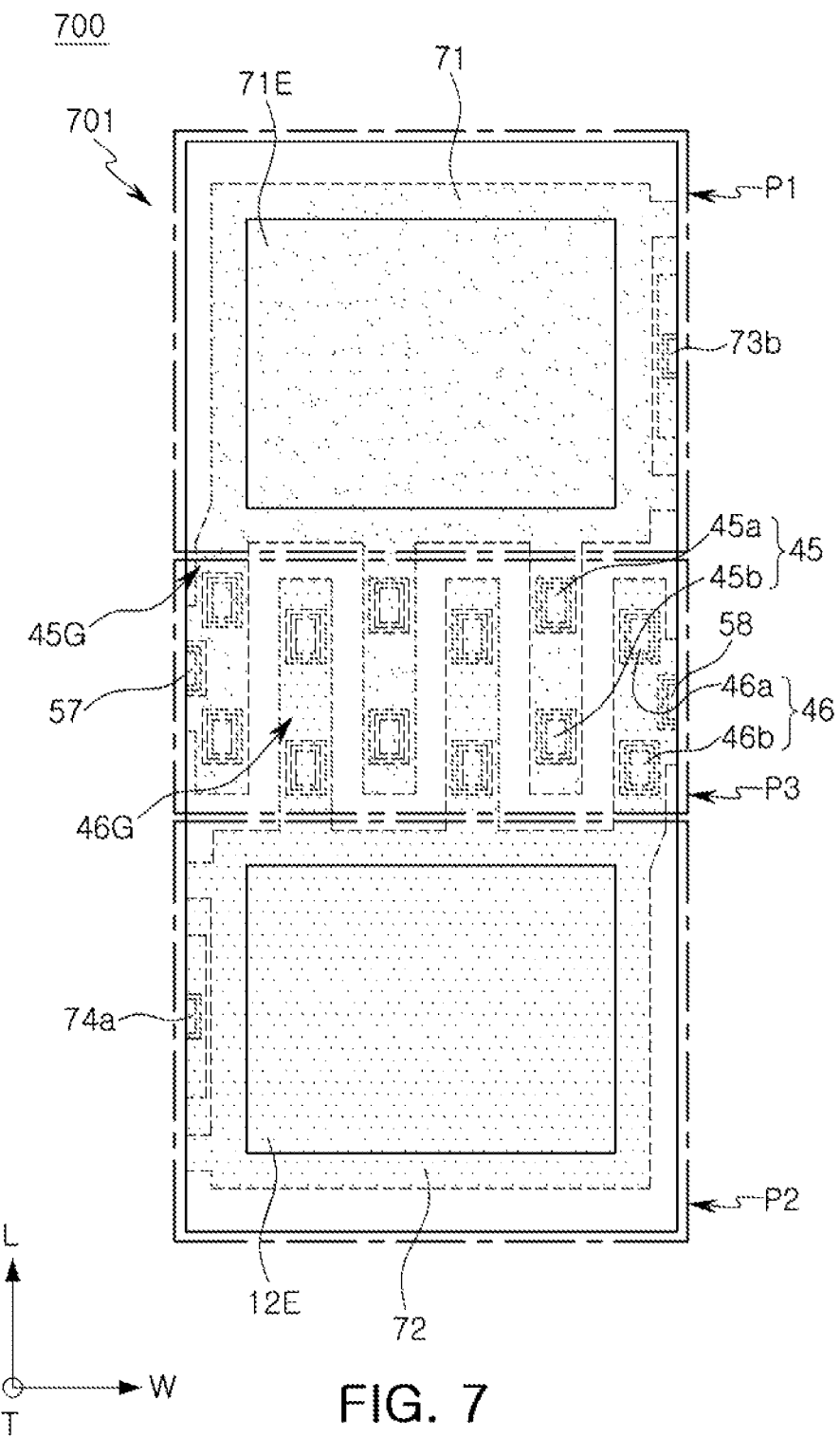
FIG. 7 is a schematic plan view of a multilayer thin-film capacitor according to a seventh exemplary embodiment in the present disclosure.

Referring to FIG. 7, an extent of the first and second edge vias 73b and 74a in the length direction L may be larger than in a width direction W, and thus the first and second edge vias 73b and 74a may have a cross sectional shape in which a long axis and a short axis may be different. As a result, areas of the first and second edge vias 73b and 74a to which first and second internal electrode layers are exposed and connected may be relatively larger.

Eighth Exemplary Embodiment

Figure 8:
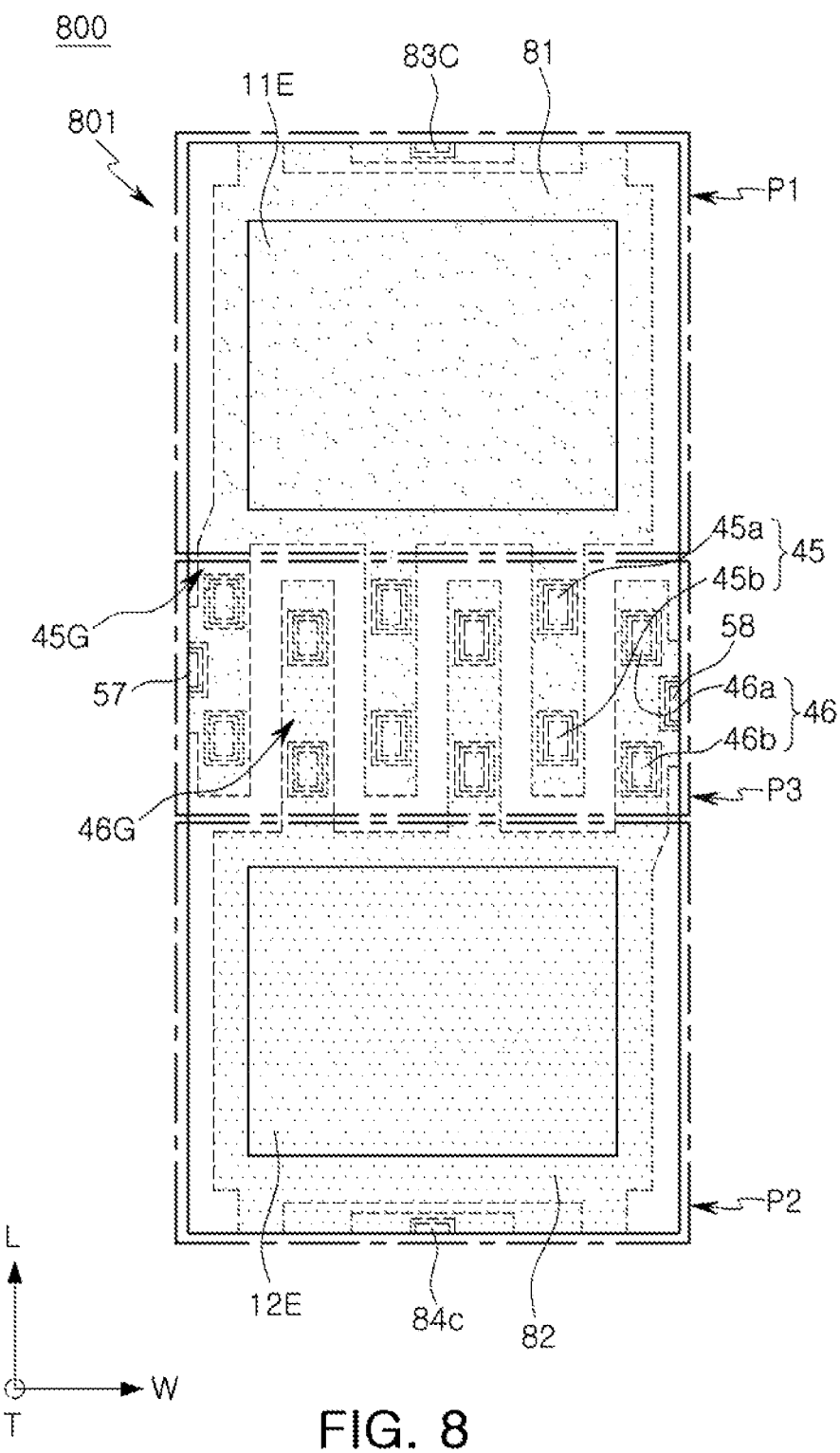
FIG. 8 is a schematic plan view of a multilayer thin-film capacitor according to an eighth exemplary embodiment in the present disclosure.

FIG. 8 illustrates a multilayer thin-film capacitor 800 according to the eighth exemplary embodiment in the present disclosure. The multilayer thin-film capacitor 800 may be similar in some respects to the multilayer thin-film capacitors 500-700 in FIGS. 5-7, and therefore may be best understood with reference thereto where like numerals designate like components not described again in detail. The multilayer thin-film capacitor 800 may include a first edge via 83c, in addition to a first external electrode 81 and a first central via 45, and a first central edge via 57 connected to the first external electrode 81, and further include a second edge via 84c, in addition to a second external electrode 82 and a second central via 46, and a second central edge via 58 connected to the second external electrode 82.

Referring to FIG. 8, the first edge via 83c may be disposed in a first section P1 at or adjacent (or along) an upper edge of a multilayer body 801 that extends along the width direction W. The first edge via 83c may be a long edge via elongated in a width direction. The multilayer thin-film capacitor 800 may further include a second edge via 84c disposed in the second section P2 at or adjacent a lower edge of the multilayer body 801 opposite the upper edge having the first edge via 83. The second edge via 84c may be a long edge via elongated in the width direction W.

Ninth Exemplary Embodiment

Figure 9:
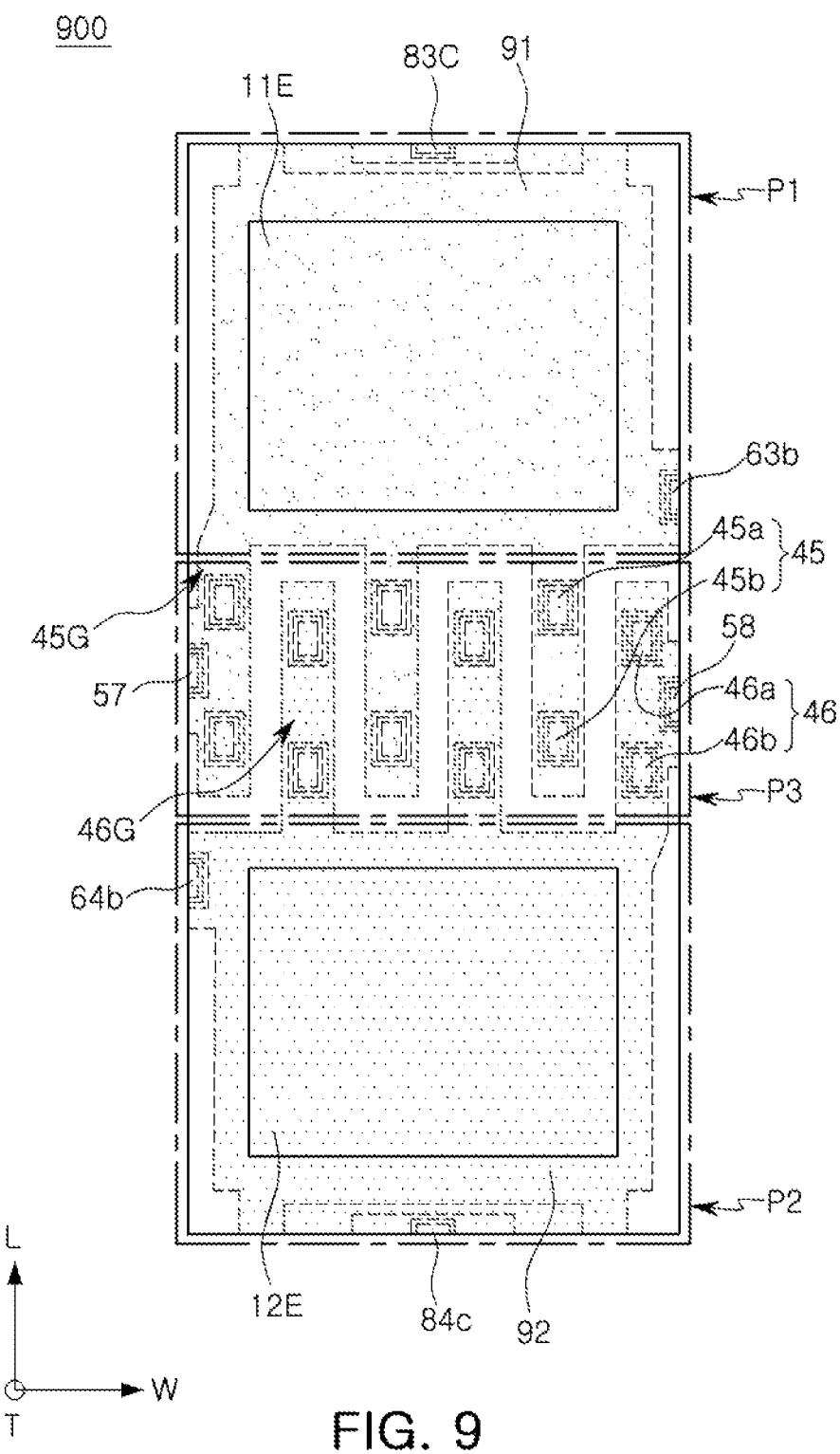
FIG. 9 is a schematic plan view of a multilayer thin-film capacitor according to a ninth exemplary embodiment in the present disclosure.

FIG. 9 illustrates a multilayer thin-film capacitor 900 according to the ninth exemplary embodiment in the present disclosure. The multilayer thin-film capacitor 900 may be similar in some respects to the multilayer thin-film capacitors 500-800 in FIGS. 5-8, and therefore may be best understood with reference thereto where like numerals designate like components not described again in detail. The multilayer thin-film capacitor 900 may include first and second edge vias 63b and 64b, as in the multilayer thin-film capacitor 600 of FIG. 6 described above. The multilayer thin-film capacitor 900 may also include first and second edge vias 83c and 84c, as in the multilayer thin-film capacitor 800 of FIG. 8.

Compared to the multilayer thin-film capacitors 600 and 800, the multilayer thin-film capacitor 900 has a relatively higher via density, and thereby the multilayer thin-film capacitor 900 may have a lower ESR.

Tenth Exemplary Embodiment

Figure 10:
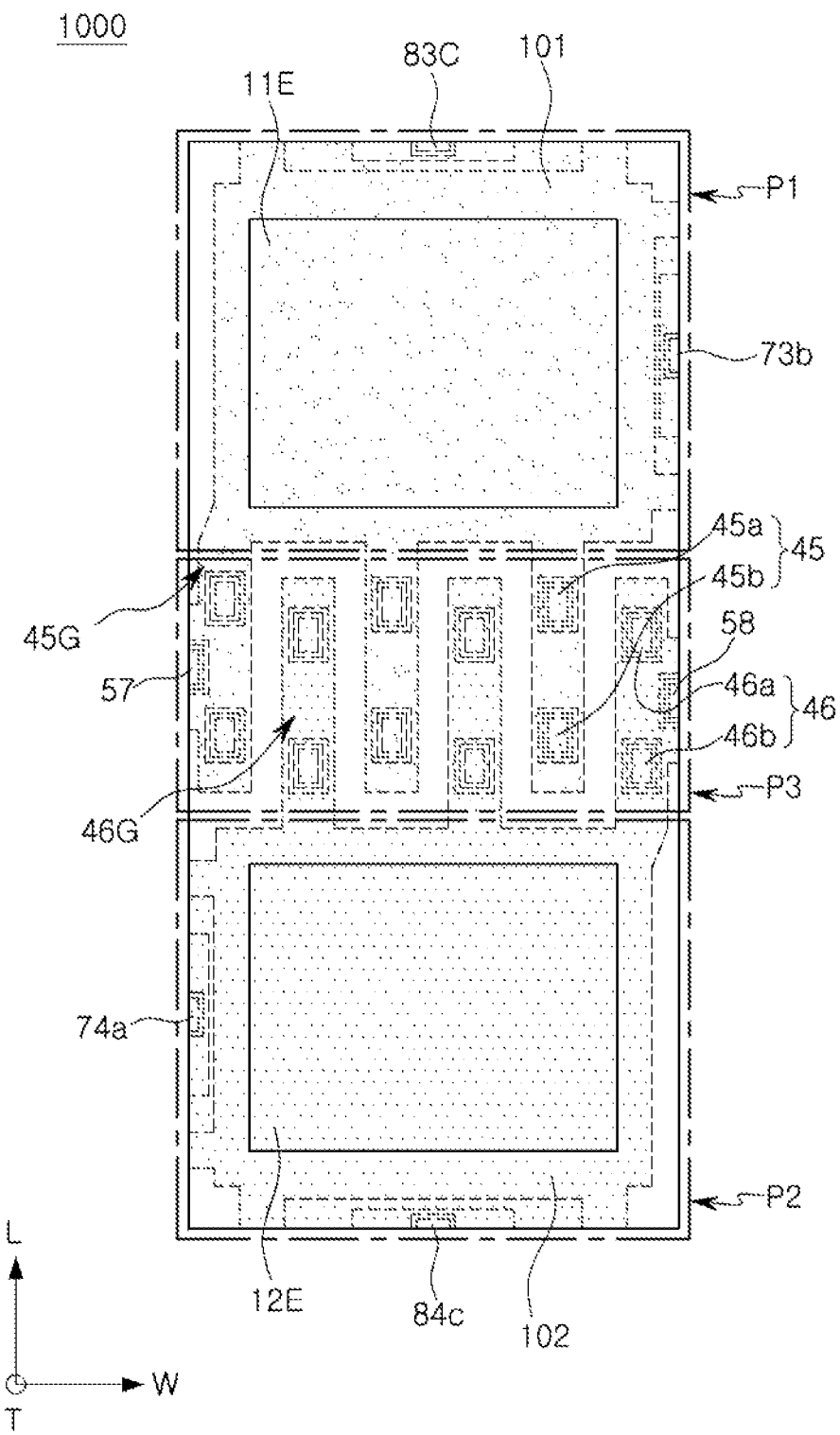
FIG. 10 is a schematic plan view of a multilayer thin-film capacitor according to a tenth exemplary embodiment in the present disclosure.

FIG. 10 illustrates a multilayer thin-film capacitor 1000 according to the tenth exemplary embodiment in the present disclosure. The multilayer thin-film capacitor 1000 may be similar in some respects to the multilayer thin-film capacitors 500-900 in FIGS. 5-9, and therefore may be best understood with reference thereto where like numerals designate like components not described again in detail. The multilayer thin-film capacitor 1000 may include first and second edge vias 73b and 74b, as in the multilayer thin-film capacitor 700 of FIG. 7 described above. The multilayer thin-film capacitor 1000 may also include and first and second edge vias 83c and 84c, as in the multilayer thin-film capacitor 800 of FIG. 8 described above.

Compared to the multilayer thin-film capacitors 700 and 800, the multilayer thin-film capacitor 1000 has a relatively higher via density, and thereby the multilayer thin-film capacitor 1000 may have a lower ESR.

Eleventh Exemplary Embodiment

Figure 11:
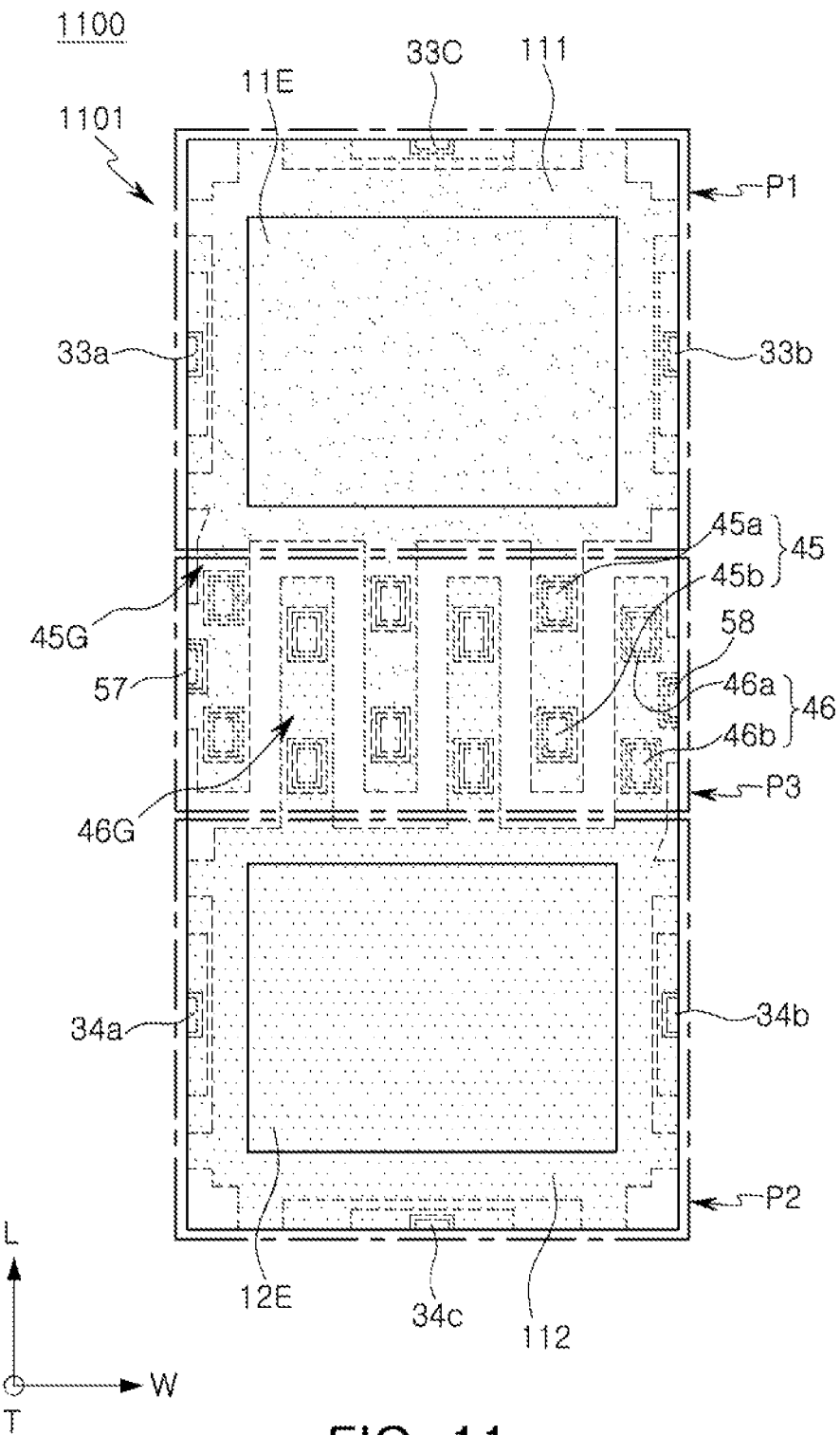
FIG. 11 is a schematic plan view of a multilayer thin-film capacitor according to an eleventh exemplary embodiment in the present disclosure.

FIG. 11 illustrates a multilayer thin-film capacitor 1100 according to the eleventh exemplary embodiment in the present disclosure. The multilayer thin-film capacitor 1100 may be similar in some respects to the multilayer thin-film capacitors 300-1000 in FIGS. 3-10, and therefore may be best understood with reference thereto where like numerals designate like components not described again in detail. As illustrated, in the multilayer thin-film capacitor 1100, vias may be disposed at or adjacent (or along) all edges of an upper surface of a multilayer body 1101.

The multilayer thin-film capacitor 1100 may include a first external electrode 111 and a plurality of first edge vias 33a to 33c disposed in a first section P1 and connected to the first external electrode 111, as in the multilayer thin-film capacitor 300 of FIG. 3. The multilayer thin-film capacitor 1100 may further include a second external electrode 112 and a plurality of second edge vias 34a to 34c disposed in a second section P2 and connected to the second external electrode 112, as in the multilayer thin-film capacitor 300 of FIG. 3. The central section P3 may be interposed between the first and second sections P1 and P2 and include multiple first central via groups 45G disposed separated from each other in a width direction W. Each first central via group 45G may include one or more first central vias 45a and 45b (one of each shown) disposed spaced apart from each other at predetermined intervals in the length direction L. The central section P3 may also include multiple second central via groups 46G disposed separated from each other in a width direction W. The first central via groups 45G and the second central via groups 46G may form an intervening pattern. Each second central via groups 46G may include one or more second central vias 46a and 46b (one of each shown) disposed spaced apart from each other at predetermined intervals in the length direction L. The first and second central via groups 45G and 46G may be disposed offset in the length direction L. Stated otherwise, the centers of the vias 45a and 46a, and the centers of the vias 45b and 46b are not collinear. The central section P3 may include first and second central edge vias 57 and 58 connected to the first and second external electrodes 111 and 112, respectively, and disposed opposite each other at or adjacent the edges of the multilayer body 1101 opposite each other in the width direction W.

The multilayer thin-film capacitors 100-1100 according to the first to eleventh exemplary embodiments described include vias disposed at or adjacent (or along) the edges of the multilayer body, and, as a result, the multilayer thin-film capacitors may have low ESR characteristics, compared to the thin-film capacitor according to the related art. Generally, as the number of vias in the multilayer thin-film capacitors increases, the ESR in the multilayer thin-film capacitors decreases. By way of example, the multilayer thin-film capacitor 1100 may have the smallest ESR compared to ESR's of the multilayer thin-film capacitors 100-1000 since the multilayer thin-film capacitor 1100 have the largest number of vias compared to number of vias in the multilayer thin-film capacitors 100-1000.

As set forth above, according to exemplary embodiments in the present disclosure, disclosed are multilayer thin-film capacitor configurations for decreasing ESR by increasing the number of vias.

While exemplary embodiments have been shown and described above, it will be apparent to those skilled in the art that modifications and variations could be made without departing from the scope of the present disclosure, as defined by the appended claims.

What is claimed is:

1. A multilayer thin-film capacitor, comprising:
a multilayer body having first and second surfaces opposite each other in a length direction, third and fourth surfaces opposite each other in a width direction, and upper and lower surfaces opposite each other in a thickness direction, and having a stacked structure including a plurality of first internal electrode layers and a plurality of second internal electrode layers alternately stacked in the thickness direction and including a dielectric layer interposed between adjacent first and second internal electrode layers;

a first external electrode connected to the plurality of first internal electrode layers and disposed in a first section of the upper surface of the multilayer body;

a second external electrode connected to the plurality of second internal electrode layers and disposed in a second section of the upper surface of the multilayer body spaced apart a predetermined interval from the first section in the length direction;

a first edge via connected to the first external electrode and disposed at at least one edge of the upper surface of the multilayer body in the first section;

a second edge via connected to the second external electrode and disposed at at least one edge of the upper surface of the multilayer body in the second section; and a plurality of first and second central vias in a central section of the upper surface of the multilayer body, the central section being disposed between the first and second sections, wherein the plurality of first central vias are connected to the first external electrode, the plurality of second central vias are connected to the second external electrode, and the plurality of first and second central vias are alternately disposed in the width direction.

2. The multilayer thin-film capacitor of claim 1, wherein the plurality of first central vias are offset from the plurality of second central vias at a predetermined interval in the length direction.

3. The multilayer thin-film capacitor of claim 1, wherein the first edge via is disposed in the first section at or adjacent at least one of two edges of the multilayer body opposite each other in the width direction.

4. The multilayer thin-film capacitor of claim 1, wherein the second edge via is disposed in the second section at or adjacent at least one of the two edges of the multilayer body opposite each other in the width direction.

5. The multilayer thin-film capacitor of claim 1, wherein the first edge via is disposed in the first section at or adjacent an edge of the multilayer body disposed in the length direction.

6. The multilayer thin-film capacitor of claim 1, wherein the second edge via is disposed in the second section at or adjacent an edge of the multilayer body disposed in the length direction.

7. The multilayer thin-film capacitor of claim 1, wherein the first edge via contacts the at least one edge of the upper surface of the multilayer body in the first section and extends along a corresponding side surface of the multilayer body, and the second edge via contacts the at least one edge of the upper surface of the multilayer body in the second section and extends along a corresponding side surface of the multilayer body.

8. A multilayer thin-film capacitor comprising:
a multilayer body having first and second surfaces opposite each other in a length direction, third and fourth surfaces opposite each other in a width direction, and upper and lower surfaces opposite each other in a thickness direction, and having a stacked structure including a plurality of first internal electrode layers and a plurality of second internal electrode layers alternately stacked in the thickness direction and including a dielectric layer interposed between adjacent first and second internal electrode layers;

a first external electrode connected to the plurality of first internal electrode layers and disposed in a first section of the upper surface of the multilayer body;

a second external electrode connected to the plurality of second internal electrode layers and disposed in a second section of the upper surface of the multilayer body spaced apart a predetermined interval from the first section at in the length direction;

a plurality of first central vias and a plurality of second central vias disposed in a central section of the upper surface of the multilayer body between the first and second sections, and connected to the first and second external electrodes, respectively;

a first central edge via disposed in the central section at a first edge of two edges of the multilayer body opposite each other in the width direction, and connected to the first external electrode; and a second central edge via disposed in the central section at a second edge opposite the first edge of the two edges of the multilayer body, and connected to the second external electrode.

9. The multilayer thin-film capacitor of claim 8, further comprising a first edge via disposed in the first section at or adjacent at least one of (1) the first or second edges of the multilayer body opposite each other in the width direction and (2) an edge of the multilayer body disposed in the length direction, the first edge via being connected to the first external electrode.

10. The multilayer thin-film capacitor of claim 8, further comprising a second edge via disposed in the second section at or adjacent at least one of (1) the first or second edges of the multilayer body opposite each other in the width direction and (2) an edge of the multilayer body disposed in the length direction, the second edge via being connected to the second external electrode.

11. The multilayer thin-film capacitor of claim 8, wherein the first and second central vias are alternately disposed in the width direction, and the first central via is disposed offset from the second central via at a predetermined interval in the length direction.

12. The multilayer thin-film capacitor of claim 8, wherein the first central edge via is disposed between adjacent first central vias, the first central vias being disposed spaced apart from each other at a predetermined interval in the length direction.

13. The multilayer thin-film capacitor of claim 8, wherein the second central edge via is disposed between adjacent second central vias, the second central vias disposed spaced apart from each other at a predetermined interval in the length direction.

14. The multilayer thin-film capacitor of claim 8, wherein the first central edge via contacts the first edge of the multilayer body and extends along one of the third and fourth surfaces of the multilayer body, and the second central edge via contacts the second edge of the multilayer body and extends along another of the third and fourth surfaces of the multilayer body.

15. A multilayer thin-film capacitor comprising:
a multilayer body having first and second surfaces opposite each other in a length direction, third and fourth surfaces opposite each other in a width direction, and upper and lower surfaces opposite each other in a thickness direction, and having a stacked structure including a plurality of first internal electrode layers and a plurality of second internal electrode layers alternately stacked in the thickness direction and including a dielectric layer interposed between adjacent first and second internal electrode layers;

a first external electrode connected to the plurality of first internal electrode layers and disposed in a first section of the upper surface of the multilayer body;

a second external electrode connected to the plurality of second internal electrode layers and disposed in a second section of the upper surface of the multilayer body spaced apart a predetermined interval from the first section at in the length direction;

a plurality of first central vias and a plurality of second central vias disposed in a central section of the upper surface of the multilayer body between the first and second sections, and connected to the first and second external electrodes, respectively;

a first central edge via disposed in the central section at or adjacent a first edge of two edges of the multilayer body opposite each other in the width direction, and connected to the first external electrode; and a second central edge via disposed in the central section at or adjacent a second edge opposite the first edge of the two edges of the multilayer body, and connected to the second external electrode, wherein the first central edge via is disposed offset from the first central via adjacent thereto by predetermined intervals in the length and width directions, and the second central edge via is disposed offset from the second central via adjacent thereto by predetermined intervals in the length and width directions.

* * * * *